(12) United States Patent
Kannler et al.

(10) Patent No.: US 8,979,221 B2
(45) Date of Patent: Mar. 17, 2015

(54) FOOT FOR A COMPUTER CASING, AND COMPUTER CASING HAVING A FOOT OF SAID TYPE

(71) Applicant: Fujitsu Technology Solutions Intellectual Property GmbH, München (DE)

(72) Inventors: Bernhard Kannler, Augsburg (DE); Michael Schmid, Dillingen (DE)

(73) Assignee: Fujitsu Technology Solutions Intellectual Property GmbH (DE)

( * ) Notice: Subject to any disclaimer, the term of this patent is extended or adjusted under 35 U.S.C. 154(b) by 0 days.

(21) Appl. No.: 14/117,478

(22) PCT Filed: Jan. 21, 2013

(86) PCT No.: PCT/EP2013/051054
§ 371 (c)(1),
(2) Date: Nov. 13, 2013

(87) PCT Pub. No.: WO2013/113582
PCT Pub. Date: Aug. 8, 2013

(65) Prior Publication Data
US 2014/0339977 A1    Nov. 20, 2014

(30) Foreign Application Priority Data

Jan. 30, 2012 (DE) .......................... 10 2012 100 737

(51) Int. Cl.
*A47B 97/00* (2006.01)
*H05K 5/02* (2006.01)
*F16F 1/373* (2006.01)
*G06F 1/18* (2006.01)

(52) U.S. Cl.
CPC ............ *H05K 5/0234* (2013.01); *F16F 1/3732* (2013.01); *G06F 1/183* (2013.01)
USPC ....................................... 312/223.2

(58) Field of Classification Search
USPC .......... 312/223.2; 248/188.2, 188.3, 673, 677
See application file for complete search history.

(56) References Cited

U.S. PATENT DOCUMENTS

| | | | |
|---|---|---|---|
| 2,037,033 A * | 4/1936 | Lord | 267/141.6 |
| 5,942,735 A | 8/1999 | Liang | |
| 6,036,287 A * | 3/2000 | Kim | 312/223.2 |
| 6,498,719 B1 * | 12/2002 | Bridges | 361/679.34 |
| 6,729,597 B2 * | 5/2004 | Cholinski et al. | 248/646 |

(Continued)

FOREIGN PATENT DOCUMENTS

| | | |
|---|---|---|
| DE | 19919302 | 11/2000 |
| DE | 202007008416 | 9/2007 |
| EP | 0 844 838 | 6/1998 |

*Primary Examiner* — Hanh V Tran
(74) *Attorney, Agent, or Firm* — DLA Piper LLP (US)

(57) ABSTRACT

A foot for a computer casing includes a base element that contacts a supporting area, a damping element that dampens oscillations and a fastening element that fastens the foot on a computer casing, wherein the damping element is mechanically arranged between the base element and the fastening element such that the fastening element and the base element are mechanically uncoupled. The damping element is ring-shaped with a centrally arranged raised portion and a portion connected thereto and extends radially outward and is guided by the raised portion through a central opening of the fastening element such that the fastening element contacts the damping element both in a radial and axial manner.

11 Claims, 4 Drawing Sheets

(56) References Cited

U.S. PATENT DOCUMENTS

| | | | |
|---|---|---|---|
| 8,333,269 B2* | 12/2012 | Dickson et al. | 188/321.11 |
| 8,511,637 B2* | 8/2013 | Mitsch | 248/677 |
| 2003/0179543 A1* | 9/2003 | Sri-Jayantha et al. | 361/683 |
| 2009/0180268 A1* | 7/2009 | Guo | 361/810 |
| 2010/0039010 A1* | 2/2010 | Hong et al. | 312/351.3 |
| 2010/0264572 A1* | 10/2010 | Konkle | 267/182 |

* cited by examiner

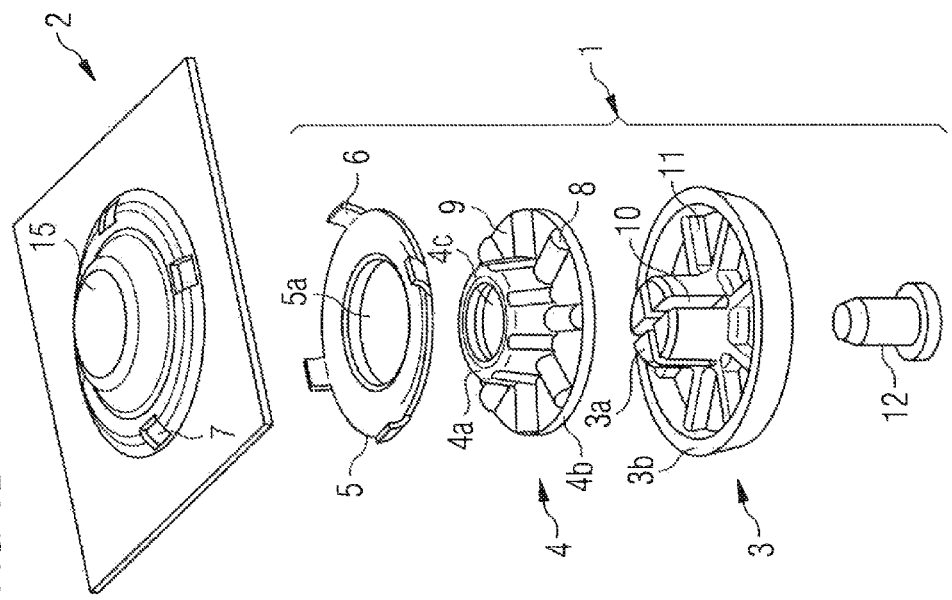
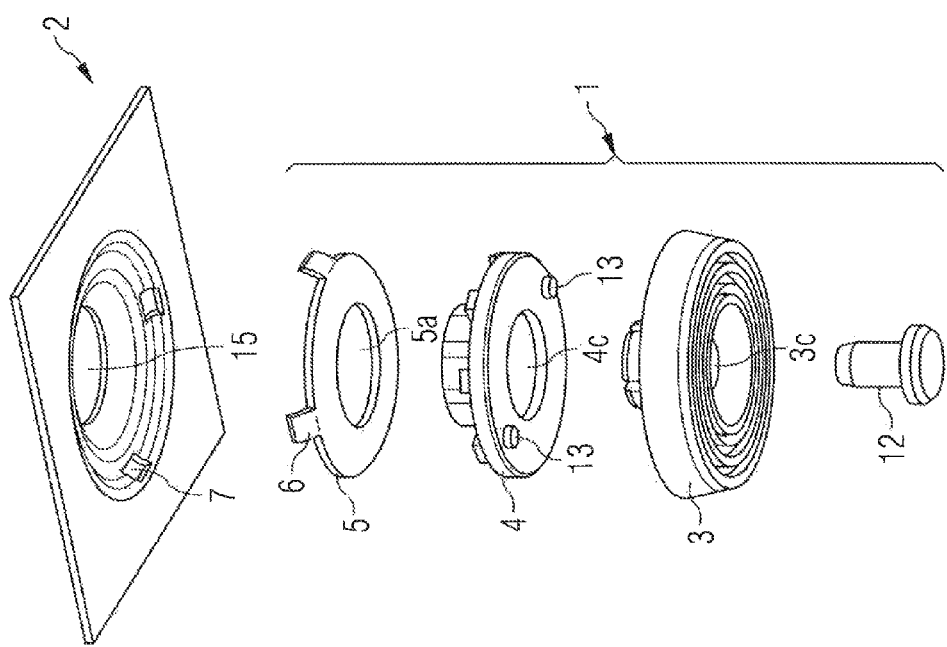

FIG 3A  A-A
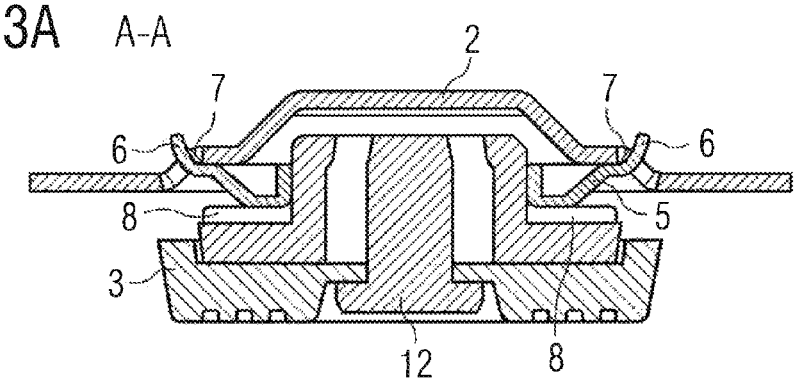
FIG 3B  B-B
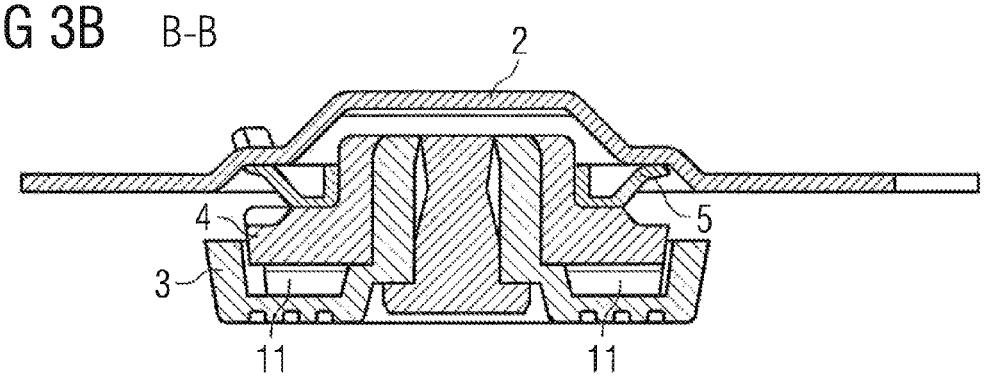
FIG 3C  C-C
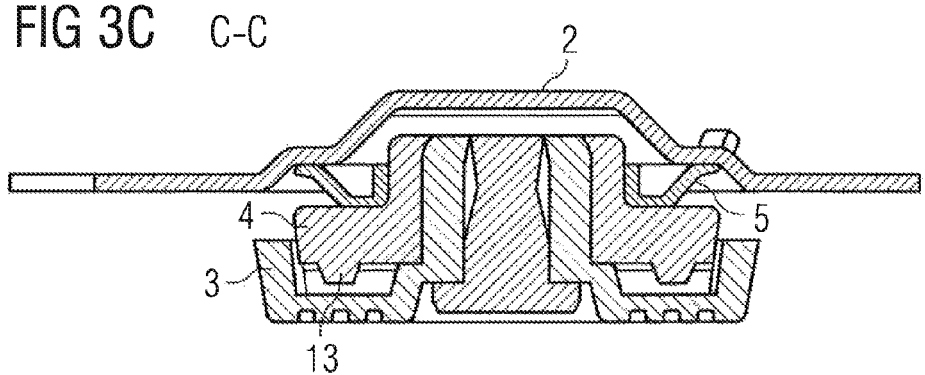

FOOT FOR A COMPUTER CASING, AND COMPUTER CASING HAVING A FOOT OF SAID TYPE

TECHNICAL FIELD

This disclosure relates to a foot for a computer casing and to a computer casing with a foot.

BACKGROUND

Feet on a computer casing serve both to set up the computer casing on a supporting surface in a sturdy manner and to reduce oscillations and sound waves generated by components inside the computer casing. In particular, rotating parts of mechanisms or cooling devices such as ventilating fans, generate oscillations or vibrations which continue in the form of structure-borne noise at mechanical connections inside the computer casing and finally as far as up to the feet on the outer casing walls. If the structure-borne noise is transmitted from a foot onto the supporting surface for the computer casing, this generates interference noises.

Solutions to reduce oscillations, vibrations and resulting structure-borne noise by one or several damping elements already exist, the damping elements being arranged on the feet. Damping elements of this type are produced, for example, from an elastic plastics material, at least part of the computer casing being coupled such that with the damping elements, vibrations and oscillations of the computer casing are able to be damped by the damping element.

However, these types of damping elements only trigger an inadequate reduction in structure-borne noise as other parts of the foot coupled to the computer casing transmit structure-borne noise from the computer casing onto the supporting surface via the foot. DE 202007008416 U1, EP 0844838 B1, DE 19919302 A1 and U.S. Pat. No. 5,942,735 A disclose feet where a base element that contacts a supporting surface and a fastening element for fastening the foot on a device housing by one or several intermediate elements are mechanically uncoupled. The intermediate elements, in this case, can act in an advantageous manner as damping elements.

The disadvantage of the aforementioned solutions, however, on the one hand, is a relatively high level of expenditure on construction and, on the other hand, damping of mechanical oscillations or vibrations which acts substantially only in an axial manner.

Consequently, it could be helpful to provide a foot for a computer casing which ensures improved reduction of oscillations and sound waves both in the axial direction and in the radial direction and, in addition, is constructed in a structurally simpler manner than conventional solutions.

SUMMARY

We provide a foot for a computer casing including a base element that contacts a supporting area; a damping element that dampens osciliations; and a fastening element that fastens the foot on a computer casing, wherein 1) the damping element is mechanically arranged between the base element and the fastening element such that the fastening element and the base element are mechanically uncoupled, 2) the damping element is ring-shaped with a centrally arranged raised portion and a portion which connects thereto and extends radially outward, and 3) the damping element is guided by way of raised portion through a central opening of the fastening element such that the fastening element contacts the damping element both in a radial and axial manner.

We also provide a computer casing including a foot wherein the foot is secured on the computer casing by the fastening element.

We further provide a computer casing including a foot wherein the foot is secured on the computer casing by the fastening element wherein the fastening element has a ring-shaped basic body and latching elements arranged on the basic body in a circumferential direction and point away from the basic body to latch with counter latching elements on a computer casing and the computer casing has openings for the latching elements of the fastening element to pass through and is otherwise free of openings in the region of the foot.

BRIEF DESCRIPTION OF THE DRAWINGS

FIG. 1A shows a perspective representation of an arrangement of a foot with part of a computer casing.

FIG. 1B shows the arrangement according to FIG. 1A in a further perspective.

FIG. 3A shows a first sectional representation of the arrangement according from FIG. 2A.

FIG. 3B shows a second sectional representation of the arrangement from FIG. 2A.

FIG. 3C shows a third sectional representation of the arrangement from FIG. 2A.

LIST OF REFERENCES

Figure 2A:
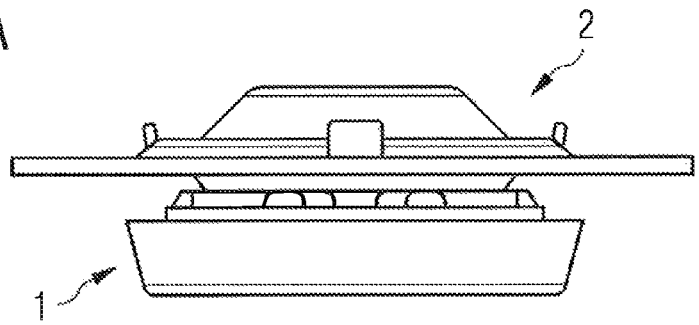
FIG. 2A shows a side view of the arrangement according to FIGS. 1A and 1B in the mounted state.

1 Foot
2 Computer casing
3 Base element
3a Raised portion on the base element
3b Portion on the base element pointing radially outward
3c Opening on the base element
4 Damping element
4a Raised portion on the damping element
4b Portion on the damping element pointing radially outward
4c Opening on the damping element
5 Fastening element
5a Opening on the fastening element
6 Latching elements of the fastening element
7 Counter latching elements on the computer casing
8 Webs on the damping element
9 Grooves on the damping element
10 Axial grooves on the base element
11 Webs on the base element
12 Mounting element
13 Centering mandrels
14 Region of the foot on the computer casing
15 Indentation on the computer casing

DETAILED DESCRIPTION

We provide a foot of the afore-mentioned type, the foot having a base element that contacts a supporting surface, a damping element that damps oscillations and a fastening element that fastens the foot on a computer casing. The damping element is arranged mechanically between the base element and the fastening element such that the fastening element and the base element are mechanically coupled. In addition, the damping element is realized in a ring-shaped manner with a centrally arranged raised portion and a portion which connects thereto and extends radially outward. The damping element is guided by way of the raised portion through a central opening of the fastening element such that the fastening element contacts the damping element both in a radial manner and in an axial manner.

The advantage of a foot of this type is that fastening of the foot on a computer casing and contact between the foot and a supporting surface are brought about by at least two different elements. At least one damping element that damps oscillations and vibrations of the computer casing is mechanically set up between said elements.

"Mechanically uncoupled" in this connection means that the base element and fastening element of the foot are not in direct mechanical contact with one another. This means, in particular, that the fastening element is in contact with the damping element and the damping element is in contact with the base element, but the base element is not in contact with the fastening element.

In this manner, oscillations of the computer casing which generate structure-borne noise are able to be damped in an improved manner, the oscillations being absorbed or interrupted by the damping element of the foot such that they are not able to be continued from the computer casing via the fastening element and finally up to the base element onto a supporting surface. Consequently, interference noises generated by vibrations or oscillations are prevented.

"Axial" means in the axial direction, that is to say along a main axis of the damping element. "Radial" means in the radial direction, that is to say in the direction radially outward from the main axis. In one example, the fastening element contacts the damping element in the axial direction on the raised portion of the damping element and in the radial direction on the portion which extends radially outward.

In this manner, oscillations propagated from the computer casing via the fastening element along the foot both in the axial direction and in the radial direction are able to be absorbed by the damping element. Consequently, it is possible to achieve improved absorption or damping of oscillations. Advantageously, oscillations are damped both in the axial and radial directions by the damping element which can be realized, for example, in an elastic manner, that the oscillations on the base element of the foot are not able to be continued onto the supporting surface.

Preferably, the fastening element has a ring-shaped basic body and latching elements arranged on the basic body in a circumferential direction and point away from the basic body, to latch with counter latching elements on a computer casing. In one example, the fastening element contacts counter latching elements on the computer casing purely of the mentioned latching elements. Consequently, the basic body of the fastening element is not in mechanical contact with the computer casing over its entire periphery, but just at occasional contact points formed by the latching elements which point away from the basic body.

A contact surface between the fastening element of the foot and a computer casing is able to be reduced such that transmission of oscillations from the computer casing to the foot is also decreased.

For example, the latching elements can be integrally formed as projections on the basic body of the fastening element, counter latching elements being realized on a computer casing, for example, as openings in a casing wall of the computer casing. The latching elements of the fastening element can then pass right through the openings. However, it is also conceivable for the latching elements to be formed in the form of screws, rivets and the like, the counter latching elements on a computer casing forming corresponding counterparts such as bores and the like.

Preferably, axially extending webs defined from one another by grooves are realized in a circumferential direction on the raised portion of the damping element. The webs also continue in a radially outward manner on the portion of the damping element extending radially outward. In one example, the damping element contacts the fastening element exclusively on the surfaces of the formed webs.

As a result of realizing the webs on the damping element, the webs being defined from one another by grooves, the contact surface of the fastening element on the damping element is divided into a plurality of part contact surfaces. As a result of the interruption in the contact between the fastening element and the damping element by the webs, the contact surface between the fastening element and the damping element is reduced both in an axial and radial manner. The result is that it is also possible to reduce transmission of oscillations from the fastening element to the damping element in the axial and radial directions. Oscillations are transmitted from the fastening element to the damping element purely on the contact faces of the webs and can be damped directly on the webs of the damping element.

In addition, interruption in a transmission of oscillations from the fastening element to the damping element is achieved along the periphery of the damping element by the webs of the damping element which are defined from one another. Oscillations are not able to be propagated along the periphery of the damping element as the webs of the damping element are defined from one another by the grooves.

In this way, oscillations of the fastening element can be prevented from being transmitted onto the damping element such that the damping element is made to oscillate over its entire surface. Rather, oscillations of the fastening element are both absorbed in a targeted manner on the webs of the damping element and the propagation thereof is interrupted by the named arrangement of the webs with grooves lying in between.

A further advantage of the design of the webs on the damping element with grooves lying in between is that the individual webs are deformable in an elastic manner on the damping element both in the axial and radial directions and also in the circumferential direction and are able to absorb oscillations of the fastening element without forwarding the oscillations directly to further walls of the damping element.

This means that essentially the damping element carries out a damping of oscillations in the radial direction from a contact surface with the fastening element toward a main axis or from a contact surface with the fastening element in the axial direction along the main axis. The webs of the damping element absorb oscillations on the contact surfaces with the fastening element and are themselves at least in part stimulated to oscillate, the oscillations being damped toward the continuously realized regions (without webs) both of the raised portion and of the portion of the damping element extending radially outward such that the damping element is essentially free of oscillations in the continuous regions.

Preferably, the base element is ring-shaped with a centrally arranged raised portion and a portion which connects thereto and extends radially outward. The base element is guided by way of the raised portion through a central opening of the damping element such that the damping element contacts the base element both in radial and axial manners.

In one example, all three elements of the foot—the fastening element, the damping element and the base element—are arranged in a staggered manner. In this case, the fastening element abuts against an outside surface on the periphery of the damping element, the base element on an opposite inside surface of the damping element passing into the central opening of the damping element. In this way, the damping element is mechanically arranged between the base element and the fastening element such that the base element and the fastening element are mechanically uncoupled, that is to say are not in direct mechanical contact with one another.

In one example, the raised portion of the base element is formed by several segments separated from one another by axially extending grooves. Alternatively or additionally, webs are also realized in a radial direction on the portion of the base element which extends radially outward. Preferably, the base element contacts the damping element exclusively by way of the surfaces of the segments and/or the formed webs. This means that the contact surface is also reduced between the damping element and the base element such that oscillation transmission is also reduced. The webs on the base element have a similar function to the webs on the damping element (see above explanations).

By segmenting the raised portion of the base element or by realizing webs on the portion of the base element which extends radially outward, it is also possible that oscillation transmission between the damping element and the base element in the circumferential direction is interrupted on the base element.

Another advantage of realizing the raised portion of the base element in the form of several segments separated from one another by grooves is that the raised portion of the base element is flexibly adaptable to a shaping of the central opening of the damping element into which the base element passes by way of the raised portion. In particular, the base element can be secured in a clamping manner on the damping element by the segments.

The damping element is preferably arranged on the base element such that the webs along the portion of the damping element extending in the radial direction are horizontally offset with respect to the webs on the portion of the base element extending in the radial direction. This means that the webs of the damping element and the webs of the base element are not arranged to coincide with one another, but are consciously arranged offset with respect to one another.

In this way, there is local distribution of contact surfaces both between the fastening element and the damping element and between the damping element and the base element. In this manner, a contact surface of the fastening element on the damping element is prevented from overlapping in a horizontal manner with a contact surface of the damping element on the base element. This means that oscillations transmitted from the fastening element onto the damping element in the axial direction peter out in the direction of the base element and are not able to be transmitted further in the axial direction onto the base element. Consequently, oscillation transmission between the fastening element and the base element by the damping element and by the characteristic shaping of the damping element and of the base element and of the arrangement thereof with respect to one another is also reduced in a considerable manner or stopped in this way.

Preferably, both the damping and base elements are produced from an environmentally compatible plastics material without a flame-resistant additive. Advantageously, both the damping element and the base element satisfy the so-called "UL94" requirements (UL94 regulation: "Tests for flammability of plastic materials for parts in devices and applications" of Underwriters Laboratories).

In particular, realizing the foot of the above-mentioned type with the base element, the damping element and the fastening element, the damping element being arranged between the base element and the fastening element and only the fastening element being in direct mechanical contact with the computer casing, allows for the use of materials for the damping element or the base element which satisfy the UL94-HB classification (HB=horizontal burning). In contrast to materials used in the case of conventional feet for computer casings, protrude in part into the computer casing and have to satisfy stricter requirements—at least the UL94-V2 classification (V2=vertical burning), UL94-HB materials allow for more flexible use in a foot of a computer casing. In particular, it is possible to use UL94-HB materials which are environmentally compatible because the materials do not project into the computer casing in the case of our foot and do not necessitate any accompanying flame-resistant additives, for example, based on chlorine, which are environmentally harmful. In this manner, our foot is very environmentally safe with reference to the materials used for the damping and base elements. Particularly advantageously, it is possible to use materials based on natural polymers.

The base element of our foot can be formed, for example, from a stable or solid plastics material from the group of thermoplastics such as polyoxymethylene (POM), polypropylene (PP), polyamide (PA) or the like.

Compared to the material of the base element, the damping element of our foot can be formed, for example, from a softer material from the elastomer group to absorb oscillations and vibrations. For example, synthetic rubber types such as ethylene-propylene-diene rubber (EPDM) or styrene-butadiene rubber (SBR) may be used for this purpose.

Advantageously, a computer casing is provided with our foot, the foot being secured on the computer casing by the fastening element. The computer casing is, for example, a casing for a desktop PC, a stand-alone PC, an all-in-one PC or a mini PC.

In particular where the foot is designed with the fastening element having a ring-shaped basic body, latching elements being arranged on the basic body pointing away from the basic body in the circumferential direction, in an advantageous manner the computer casing has openings for the latching elements of the fastening element to pass through, the computer casing being otherwise free of openings in the region of the foot. This means that the computer casing does not have an opening in particular through which parts of the damping element or of the base element project into the computer casing. The single mechanical connection between the foot in question and the computer casing is obtained by the fastening element. It is also possible as a result of the method of construction to use materials for the damping element and the base element which conform to UL94-HB, as explained above.

Our feet for a computer casing are explained in the following description of the figures by way of the Drawings.

FIG. 1A shows an arrangement with a foot 1 and part of a computer casing 2. The foot 1 includes several parts realized and shaped such that they interlock in a form-fitting manner and form the foot 1.

The foot 1 in particular has (from top to bottom in the arrangement) a fastening element 5, a damping element 4 and a base element 3 and, finally, a mounting element 12. The fastening element 5 fastens the foot 1 on a wall of the computer casing 2. The damping element 4 is mechanically arranged between the fastening element 5 and the base element 3 and dampens oscillations of the computer casing 2. The base element 3 forms the bottom part of the foot 1 in the direction of a supporting surface and provides sturdy contact between a computer casing 2 and the supporting surface via the foot 1.

The fastening element 5 has a ring-shaped basic body with a centrally arranged opening 5a. In the circumferential direction, latching elements 6 are arranged on the basic body of the fastening element 5 in a radially outward manner and point away from the basic body. In the example shown in FIG. 1A, the latching elements 6 are formed as projections. The latching elements 6 interact with counter latching elements 7 on the computer casing 2. In the example shown, the counter latching elements 7 are in the form of openings in the wall of the computer casing 2. The latching elements 6 of the fastening element can be inserted into the openings 7 and secure the fastening element 5 in a clamp-type manner on the computer casing 2. The fastening element 5 can be produced, for example, from metal.

The damping element 4 is ring-shaped and has a central opening 4c. The damping element 4 includes a raised portion centrally arranged on the damping element 4 and a portion which extends radially outward. The damping element 4 is formed such that it is able to pass through the central opening 5a of the fastening element 5 by way of the raised portion.

The damping element 4 can be produced, for example, from an elastomer and is preferably flexible such that vibrations or oscillations of the computer casing 2 are dampened by the damping element 4 such that the vibrations are not able to be transmitted onto a supporting surface via the foot 1. The method of operation of the damping element 4 is explained in more detail below.

Centering mandrels 13 which position the damping element 4 on the base element 3 are arranged on the under surface of the portion of the damping element 4 which extends radially outward.

The base element 3 is also ring-shaped with a central opening 3c. In addition, the base element 3 has a raised portion and a portion which extends radially outward. The base element 3 is formed such that it is able to be inserted into the central opening 4c of the damping element by way of the raised portion. The under surface of the portion of the base element 3 which extends radially outward positions the foot 1 in a non-slip and sturdy manner on a supporting surface. The base element 3 can be produced, for example, from a sturdy plastics material from the thermoplastics group and can form a durable and non-slip under surface of the foot 1.

The base element 3, the damping element 4 and the fastening element 5 can be secured against one another in the mounted state by a mounting element 12, which is pin-shaped in the example. The mounting element 12 can be a pin, a screw, a nail or the like.

In the region of the fastening of the foot 1, the computer casing 2 has an indentation 15 which is curved toward an inside surface of the computer casing 2. As a result of the indentation 15, the arrangement of the foot 1 is able to be accommodated in a space-saving manner on the computer casing 2 such that the overall height of the total arrangement of the foot 1 on the computer casing 2 is low. The computer casing 2 is, for example, a casing for a desktop PC, a stand-alone PC, an all-in-one PC or a mini PC.

In addition, the computer casing 2 just has openings 7 that secure the latching elements 6 of the fastening element 5 (see explanations above). The computer casing 2 is otherwise free of openings in the region of the foot 1. This means that the only openings of the computer casing 2 are formed by the narrow openings 7. Just the latching elements 6 of the fastening element 5 project in part through the openings 7 into an interior of the computer casing 2. Further parts of the foot 1 such as, for example, the damping element 4 or the base element 3, are neither in direct mechanical contact with the computer casing 2 in the mounted state nor do they project through openings into the computer casing 2.

The advantage of the stacked or staggered arrangement of the parts of the foot 1 is that the fastening element 5 and the base element 3 are mechanically uncoupled in the mounted state (not shown). This means that the fastening element 5 and the base element 3 are not in direct mechanical contact with one another. The damping element 4 is mechanically arranged between the fastening element 5 and the base element 3. In this way, oscillations which are generated, for example, by rotating parts inside the computer casing 2 and transmitted onto the fastening element 5, are dampened by the damping element 4 such that further oscillation transmission onto the base element 3 and finally onto a supporting surface is reduced or completely stopped. Interference noises caused by structure-borne noise are reduced or stopped in this way.

The design and arrangement of the parts of the foot 1 on the computer casing 2, in particular the fact that in the mounted state neither the damping element 4 nor the base element 3 project into the computer casing, also allows for the use of materials for the damping element 4 and the base element 3 which are produced from environmentally compatible plastics material without any flame-resistant additive and correspond to the UL94-HB standard.

FIG. 1B shows the arrangement according to FIG. 1A from a different perspective. FIG. 1B clearly shows, in particular, the structural design of the damping element 4 and of the base element 3.

The damping element 4 includes, as already explained, a raised portion 4a and a portion 4b which extends radially outward with a central opening 4c. Webs 8 extend in the axial direction on the raised portion 4a and continue outward in the radial direction on the portion 4b in the manner of a star. The webs 8 are defined from one another by grooves 9. Consequently, in each case the webs 8 form elevations on the basic body of the damping element 4. The effect of the webs 8 is that the contact surface of the fastening element 5 with the damping element 4 is reduced in the mounted state such that the fastening element 5 contacts the damping element 4 only on the webs 8.

In addition, FIG. 1B shows the base element 3 with a raised portion 3a and a portion 3b which extends radially outward. The portion 3a is formed in the form of four segments defined from one another by axial grooves 10 in the form of a cross recess. Webs 11, which radially extend outward in a star-shaped manner on the portion 3b, are realized on the portion 3b. The effect of the segments of the raised portion 3a and the grooves 11 of the portion 3b is that the contact surface between the damping element 4 and the base element 3 is reduced in the mounted state. This means that the damping element 4 with its ring-shaped basic body contacts the base element 3 only on the segments of the portion 3a and on the webs 11 of the portion 3b.

As a result of the structure of the damping element 4 and the base element 3, a plurality of contact surfaces are consequently formed both between the fastening element 5 and the damping element 4 and between the damping element 4 and the base element 3. As a result of realizing the webs 8 and 11 on the damping element 4 and on the base element 3 and of a segmenting of the portion 3a on the base element 3, it is consequently possible to interrupt or prevent propagation of oscillations of the computer casing 2 via the foot 1 both in the axial and radial directions as well as in the circumferential direction. In this way, both oscillations of the computer casing 2 are dampened by the damping element 4 and the propagating direction of the oscillations from the computer casing 2 along the foot 1 in the direction of a supporting surface is interrupted.

Segmenting of the portion 3a of the base element 3 also has another further function. By inserting the pin-shaped mounting element 12 into the opening 3a on the base element 3 (see FIG. 1A), the segments of the portion 3a are forced radially outward such that in the mounted state of the foot 1, that is to say in the case of a stacked arrangement of the three elements 3, 4, 5, they secure both the base element 3 in a clamping manner on the damping element 4 and, where applicable, also the damping element 4 in an indirect clamping manner on the base element 5. The segments of the portion 3a then press against the inside wall of the damping element 4 inside the opening 4c.

A clamping connection between the damping element 4 and the fastening element 5 is additionally achieved as a result of the raised portion 4a of the damping element 4 widening in the radial direction in the direction of the portion 4b. The fastening element 5 can be pressed onto the damping element 4 and secured in a clamping manner on the damping element 4 in this way.

FIG. 2A shows the arrangement according to FIGS. 1A and 1B in the mounted state. In particular, FIG. 2A illustrates the space-saving accommodating of the foot 1 on the computer casing 2.

Figure 2B:
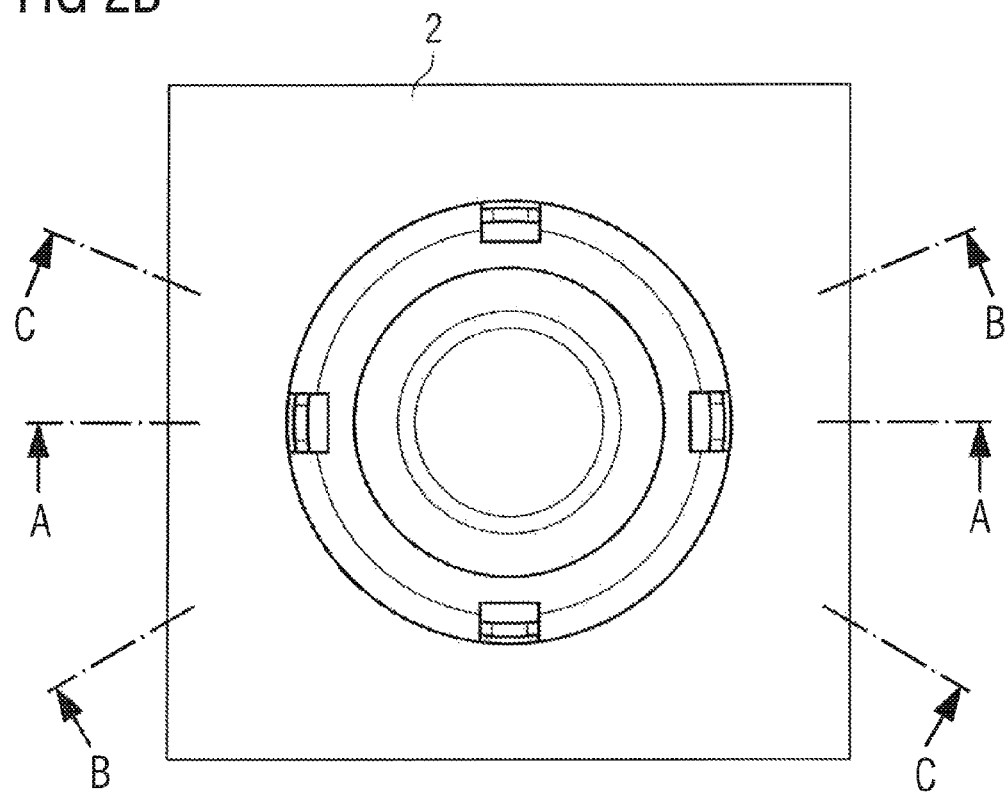
FIG. 2B shows a top view onto the arrangement according to FIG. 2A.

FIG. 2B shows a top view of the arrangement according to FIG. 2A, different sections through the arrangement on the computer casing 2 being indicated by sectional axes A-A, B-B and C-C which will be explained below.

FIG. 3A shows a first section through the arrangement according to the sectional axis A-A from FIG. 2B. FIG. 3A clearly shows the securement of the foot 1 on the computer casing 2 by the latching elements 6, the latching elements 6 passing though openings 7 on the computer casing 2. The fastening element 5 consequently secures the foot in a clamp-like manner on the computer casing 2 by the latching elements 6.

In addition, the fastening element 5 contacts the damping element 4 both in a radial and axial manner. In particular, the fastening element 5 rests on the webs 8 of the damping element 4, as has been explained with regard to FIG. 1B.

In addition, the damping element 4 finally contacts the base element 3. The elements 3, 4 and 5 are secured against one another in a clamping manner by the mounting element 12.

FIG. 3B shows a second sectional representation according to an axis B-B from FIG. 2B. FIG. 3B shows in particular contact between the damping element 4 and the base element 3, the damping element 4 resting on the webs 11 of the base element 3.

FIG. 3C shows a third sectional representation according to an axis C-C from FIG. 2B. FIG. 3C clearly shows the damping element 4 aligned on the base element 3 by the centering mandrels 13 of the damping element 4. It is possible to secure the damping element 4 on the base element 3 in a predetermined manner in this way.

FIGS. 3A to 3C illustrate radial as well as axial contact between the fastening element 5 and the damping element 4. The advantage of this is that oscillations of the computer casing 2 are able to be introduced into the damping element 4 both in the axial and radial directions and are able to be dampened by the damping element 4. In addition, contact between the fastening element 5 and the damping element 4 via the webs 8 and between the damping element 4 and the base element 3 via the webs 11 brings about interrupted contact between the three elements such that propagation of oscillations from the fastening element 5 onto the base element 3 via the damping element 4 is reduced further or is completely stopped.

Figure 4:
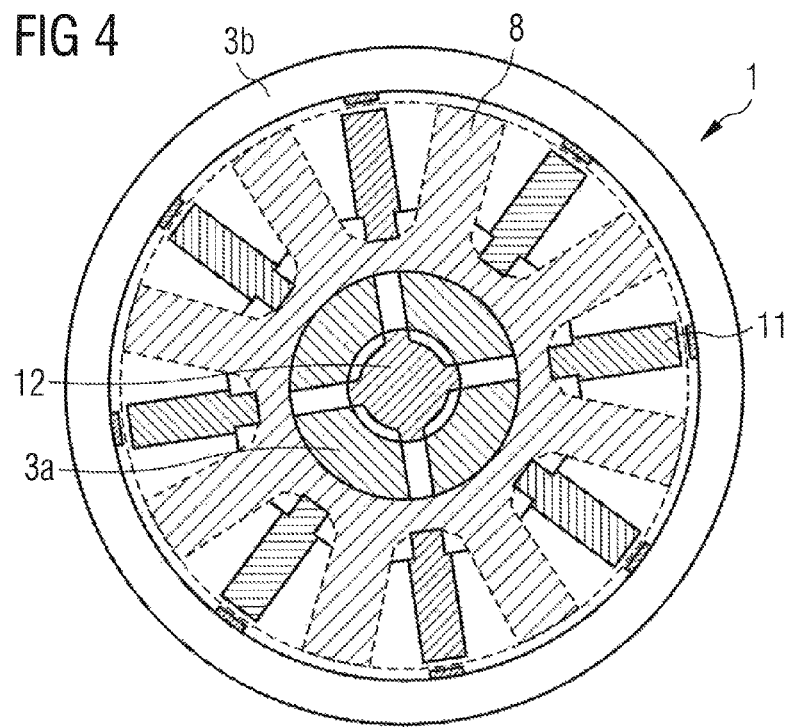
FIG. 4 shows a schedmatic representation of a top view onto parts of a foot.

FIG. 4 shows a schematic representation of a top view onto the damping element 4 and the base element 3 which are held together by the mounting element 12.

For improved clarity, the damping element 4 appears transparent such that it is possible to see an offset arrangement of the webs 8 of the damping element 4 and of the webs 11 on the portion 3b of the base element 3.

The effect of the offset arrangement of the webs 8 and 11 is that contact between the fastening element 5 and the webs 8 of the damping element 4, as explained above, is offset to contact between the damping element 4 and the webs 11 of the base element 3. In this way, oscillations transmitted from the fastening element 5 onto the damping element 4 on the webs 8 are not also transmitted directly at the same contact point onto the webs 11 of the base element 3. Consequently, oscillation transmission is interrupted in a targeted manner.

The same is achieved by the cross-recess-like segmenting of the portion 3a of the base element 3, contact between the base element 3 and the damping element 4 being interrupted in a corresponding manner in the region of the portion 3a such that oscillation propagation from the damping element 4 to the base element 3 is interrupted along the circumferential direction of the portion 3a.

Figure 5:
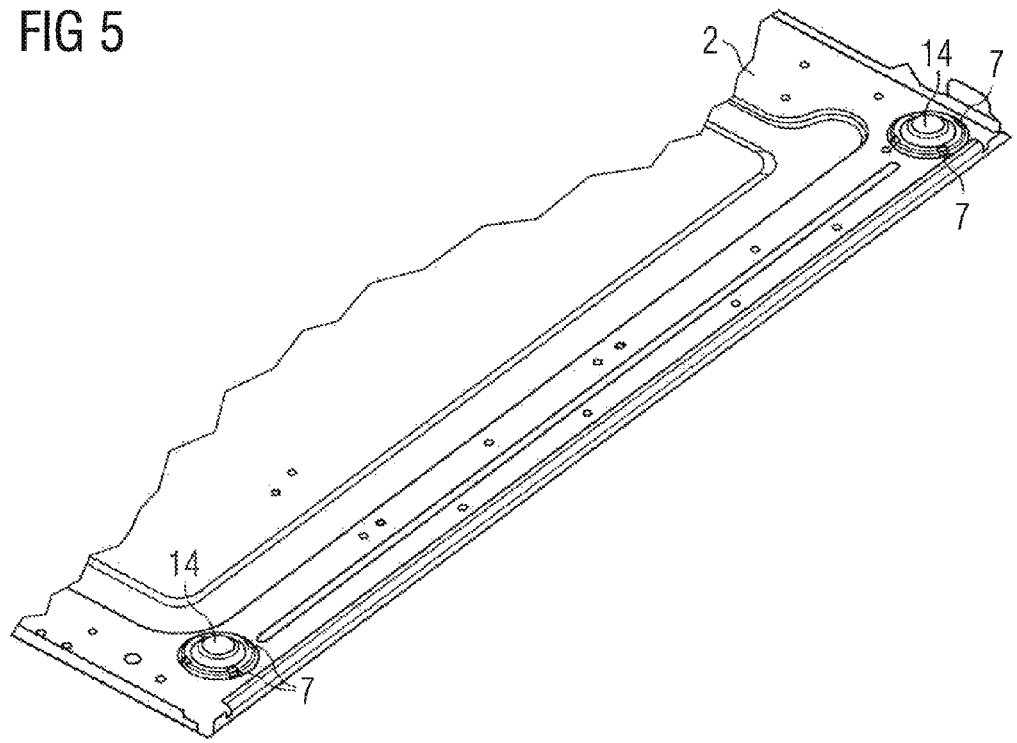
FIG. 5 shows part of a computer casing.

Finally, FIG. 5 shows part of a computer casing 2 with the regions 14 in which feet 1 are able to be mounted on counter latching elements 7 of the computer casing 2, in this case in the form of openings.

The structural design of a foot 1 and the arrangement thereof on a computer casing 2 allows for targeted damping of mechanical oscillations of the computer casing 2 both in the radial and axial directions such that oscillation transmission from the computer casing 2 onto a supporting surface via the foot 1 can be reduced or stopped in a targeted manner. This reduces generation of structure-borne noise.

In addition, the structural development of a foot 1 allows for targeted interruption of oscillation propagation along the foot 1 by offset contact between the three elements of the foot 1—the fastening element 5, the damping element 4 and the base element 3. Oscillation transmission from the computer system 2 onto a supporting surface via the foot 1 is also reduced or completely stopped in this way.

In addition, the structural design of a foot 1 of this type, penetration of which into the computer casing 2 is produced only at individual contact points of a fastening element 5, allows for the use of materials for the damping element 4 and the base element 3 which, instead of having to meet the strict requirements of the UL94-V2 standard, simply have to meet the requirements of the UL94-HB standard. This allows for a more flexible choice of material for the damping element 4 and the base element 3.

Preferably, the damping element 4 and the base element 3 can be realized to be exchangeable such that the thickness thereof is able to be adapted to different mechanical requirements for a computer casing 2, in particular to the different weight of a computer casing 2.

All the representations are chosen purely as examples.

The invention claimed is:

1. A foot for a computer casing comprising:
   a base element that contacts a supporting area;
   a damping element that dampens oscillations; and
   a fastening element that fastens the foot on a computer casing, wherein 1) the damping element is mechanically arranged between the base element and the fastening element such that the fastening element and the base element are mechanically uncoupled, 2) the damping element is ring-shaped with a centrally arranged raised portion and a portion which connects thereto and extends radially outward, and 3) the damping element is guided by way of the raised portion through a central opening of the fastening element such that the fastening element contacts the damping element both in a radial and axial manner, and wherein axially extending webs defined from one another by grooves are arranged in a circumferential direction on the raised portion of the damping element and the webs continue in a radially outward manner on the portion of the damping element extending radially outward such that the damping element contacts the fastening element on surfaces of the formed webs.

2. The foot according to claim 1, wherein the fastening element has a ring-shaped basic body and latching elements arranged on the basic body in a circumferential direction and point away from the basic body to latch with counter latching elements on a computer casing.

3. The foot according to claim 2, wherein axially extending webs defined from one another by grooves, are arranged in a circumferential direction on the raised portion of the damping element and the webs continue in a radially outward manner on the portion of the damping element which extends radially outward such that the damping element contacts the fastening element on surfaces of the formed webs.

4. The foot according to claim 1, wherein the base element is ring-shaped with a centrally arranged raised portion and a portion which connects thereto and extends radially outward, and the base element is guided by way of the raised portion through a central opening of the damping element such that the damping element contacts the base element both in a radial and axial manner.

5. The foot according to claim 4, wherein the raised portion of the base element is formed by several segments separated from one another by axially extending grooves, and webs are arranged in a radial direction on the portion of the base element which extends radially outward such that the base element contacts the damping element by way of the surfaces of the segments as well as the formed webs.

6. The foot according to claim 5, wherein the damping element is arranged on the base element such that the webs along the portion of the damping element which extends in the radial direction are horizontally offset with respect to the webs on the portion of the base element which extends in the radial direction.

7. The foot according to claim 6, wherein a pin-shaped mounting element is inserted into a central opening of the base element such that the segments of the raised portion of the base element are forced radially outward by the mounting element and secure the damping element in a clamping manner on the base element.

8. The foot according to claim 5, wherein a pin-shaped mounting element is inserted into a central opening of the base element such that the segments of the raised portion of the base element are forced radially outward by the mounting element and secure the damping element in a clamping manner on the base element.

9. The foot according to claim 1, wherein both the damping element and the base element are produced from an environmentally compatible plastics material without a flame-resistant additive.

10. A computer casing comprising a foot according to claim 1, wherein the foot is secured on the computer casing by the fastening element.

11. A computer casing comprising a foot according to claim 1, wherein the foot is secured on the computer casing by the fastening element, wherein the fastening element has a ring-shaped basic body and latching elements arranged on the basic body in a circumferential direction and point away from the basic body to latch with counter latching elements on a computer casing, and the computer casing has openings for the latching elements of the fastening element to pass through and is otherwise free of openings in the region of the foot.

* * * * *